(12) United States Patent
Lemire et al.

(10) Patent No.: US 10,581,214 B2
(45) Date of Patent: Mar. 3, 2020

(54) HIGH POWER LOCKOUT SWITCH FOR LASER DEVICE WITH THREADED ACTUATOR

(71) Applicant: Wilcox Industries Corp., Newington, NH (US)

(72) Inventors: Gary M. Lemire, Lee, NH (US); Douglas Harwood, Bedford, NH (US)

(73) Assignee: Wilcox Industries Corp., Newington, NH (US)

( * ) Notice: Subject to any disclaimer, the term of this patent is extended or adjusted under 35 U.S.C. 154(b) by 0 days.

(21) Appl. No.: 15/861,025

(22) Filed: Jan. 3, 2018

(65) Prior Publication Data

US 2018/0219349 A1 Aug. 2, 2018

Related U.S. Application Data

(60) Provisional application No. 62/446,050, filed on Jan. 13, 2017.

(51) Int. Cl.
| | |
|---|---|
| *H01S 3/02* | (2006.01) |
| *F41J 5/00* | (2006.01) |
| *F41G 1/35* | (2006.01) |
| *H01S 5/042* | (2006.01) |
| *H01S 5/022* | (2006.01) |

(52) U.S. Cl.
CPC .................. *H01S 3/02* (2013.01); *F41G 1/35* (2013.01); *F41J 5/00* (2013.01); *H01S 5/042* (2013.01); *H01S 5/022* (2013.01)

(58) Field of Classification Search
None
See application file for complete search history.

(56) References Cited

U.S. PATENT DOCUMENTS

| | | | | |
|---|---|---|---|---|
| 8,206,040 | B1* | 6/2012 | Huculak | G02B 6/4292 385/53 |
| 10,012,474 | B2* | 7/2018 | Teetzel | F41G 3/065 |
| 2011/0032960 | A1* | 2/2011 | Gerlitz | A61N 5/0616 372/29.021 |
| 2015/0247703 | A1* | 9/2015 | Teetzel | F41G 3/065 356/5.01 |

\* cited by examiner

*Primary Examiner* — Tod T Van Roy
(74) *Attorney, Agent, or Firm* — McLane Middleton, Professional Association

(57) ABSTRACT

A lockout system for a laser device of a type having a laser emitter operable to emit a laser beam at a plurality of intensity levels includes a lockout switch operable to be placed in either a first state or a second state, wherein the laser device is configured to prevent actuation of the laser emitter at an intensity level above a preselected threshold intensity level when the lockout switch is in the first state and to permit actuation of the laser emitter at an intensity level above the preselected threshold intensity level when the lockout switch is in the second state. A lockout key operable to transition the lockout switch between the first state and the second state. In a further aspect, a laser sight device incorporating the lockout system herein is provided.

21 Claims, 5 Drawing Sheets

HIGH POWER LOCKOUT SWITCH FOR LASER DEVICE WITH THREADED ACTUATOR

CROSS REFERENCE TO RELATED APPLICATION

This application claims the priority benefit of U.S. provisional application No. 62/446,050 filed Jan. 13, 2017. The aforementioned application is incorporated herein by reference in its entirety.

BACKGROUND

The present disclosure relates to laser sighting devices for weapons and, more particularly, to a safety feature for laser devices having a dual mode laser operable in either or both a higher power mode and a lower power mode of operation.

Laser sighting or targeting systems are known in the art for sighting a firearm or other form of weapon on an intended target. Commonly, a laser sight is mounted on a firearm, such as an accessory mounting rail. When properly aligned with the barrel of the firearm, the laser will direct a beam to the target, which will appear as a dot on the target where a bullet or other projectile will strike when the weapon is fired. Known laser sights generally comprise one or more laser devices configured to emit a laser beam onto a target for the purpose of aiding the user in aiming the barrel of a firearm or weapon. Such laser sights may have one or more lasers of varying and/or variable intensities to be used in different scenarios.

One advantage of the present development is that it provides a safety improvement to laser sighting devices and assemblies by preventing actuation of a laser at certain power or intensity levels, e.g., when eye-safe operation of the laser device is desired.

It will be recognized that laser devices employing the presently disclosed safety system may advantageously be used in connection with military or tactical firearms, but the present development may be used in connection with all manner of laser devices, including aiming, targeting designating, and range finding devices and all manner of weapon types and calibers.

SUMMARY

In one aspect, a lockout system is provided for a laser device having a laser emitter operable to emit a laser beam at a plurality of intensity levels. The lockout system comprises a lockout switch operable to be placed in either a first state or a second state. The laser device is configured to prevent actuation of the laser emitter at an intensity level above a preselected threshold intensity level when the lockout switch is in the first state and to permit actuation of the laser emitter at an intensity level above the preselected threshold intensity level when the lockout switch is in the second state. A lockout key is operable to transition the lockout switch between the first state and the second state.

In another aspect, a laser sight device for a weapon includes a housing attachable to the weapon and a laser emitter disposed within the housing and operable to emit a laser beam at a plurality of intensity levels. A lockout switch is operable to be placed in either a first state or a second state, wherein the laser sight device is configured to prevent actuation of the laser emitter at an intensity level above a preselected threshold intensity level when the lockout switch is in the first state and to permit actuation of the laser emitter at an intensity level above the preselected threshold intensity level when the lockout switch is in the second state. A lockout key is operable to transition the lockout switch between the first state and the second state.

In another aspect, a laser sight device comprises a lockout switch providing the user with the ability to toggle between high and low intensity (e.g., to reduce the laser power or intensity output to so-called and/or designated "eye safe levels"), or, alternatively, to select a desired intensity from within a range of intensities. In preferred embodiments, the lockout switch is switchable between at least two states, depending on whether the lockout screw is in an installed state or a stored state. The lockout switch is configured to permit actuation of a laser at a power level at or above a threshold level when the lockout switch is in the installed state and to prevent actuation of the laser at a power level above the threshold level when the lockout switch is in the stored state. In this manner, the user or personnel are prevented from accidentally switching from a low (e.g., eye safe) power mode to a high (e.g., eye damaging) power mode when high laser power operation is not warranted, e.g., when the devices are being used in training exercises.

In more limited aspects, the apparatus also includes additional actuating means, for example, keypad or buttons (e.g., laser power increment and decrement keys or buttons), on screen interface, including hierarchal menus, cursor or pointer controlled graphical user interface, or touch screen interface, a switch, dial, or knob, or the like to select a desired laser intensity.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENT

Figure 1:
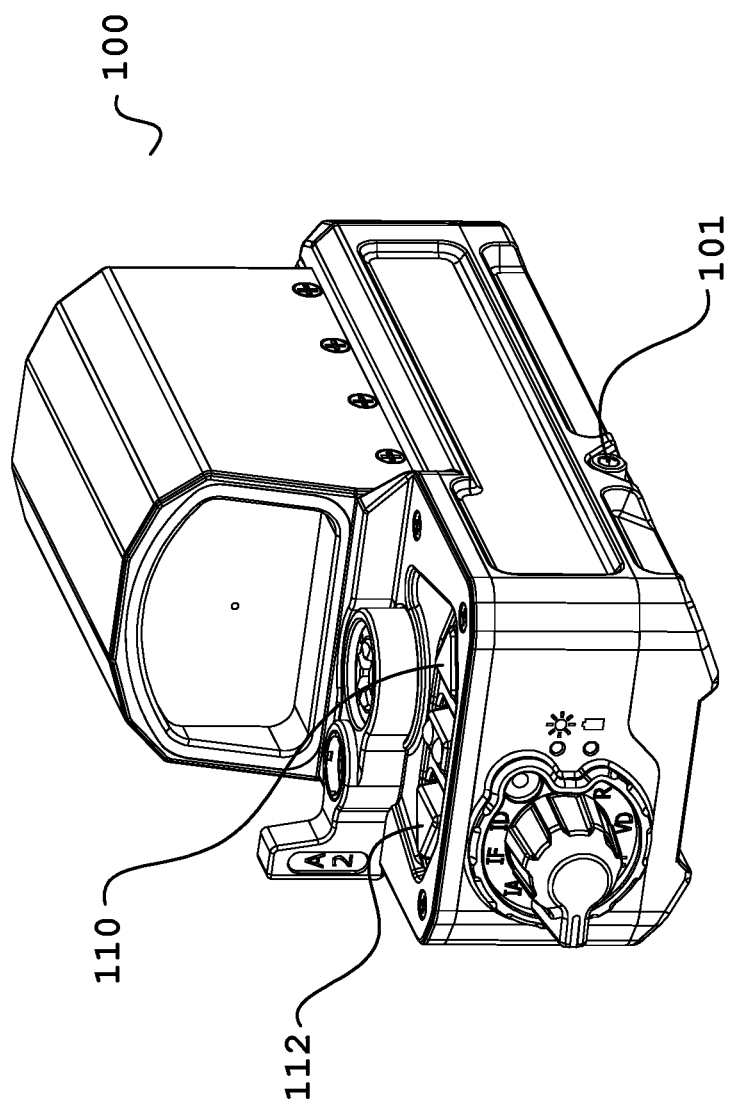
FIG. 1 is an isometric view of a laser sight device incorporating a laser lockout switch with screw actuator in accordance with an exemplary embodiment of the invention, showing the screw actuator in the installed state, taken generally from above, the front, and left side.

Referring now to the drawings, FIGS. 1-5 illustrate an exemplary high power lockout switch as incorporated into an exemplary laser sighting device 100. Although the present development will be described herein primarily by way of reference to a preferred embodiment wherein the laser device comprises a combination laser sight and reflex sight, it will be recognized that the high laser power lockout switch disclosed herein can be employed in connection with all manner of laser devices including laser pointers, designators, illuminators, range fingers, and the like.

The exemplary laser sighting device includes one or more laser units, wherein the laser output power of the one or more of the laser units is adjustable.

In certain embodiments where adjustable laser output is provided, the laser output power can be toggled between a low power mode (e.g., high laser output levels inaccessible) and a high powered mode (e.g., high laser output levels selectable). A low power, eye safe mode is useful, for example, in preventing eye damage when using the unit during training exercises. In alternative embodiments where adjustable laser output is provided, the laser output power can be incrementally adjusted within a range of intensities. In particularly preferred embodiments, adjustment of the laser power level to a level above an eye-safe level requires a safety key. In the illustrated embodiments, the laser safety key is in the form of a threaded lockout screw 101.

In some embodiments, when the threaded lockout screw 101 is in the operative stored position, it unlocks or increases the range of selectable power level selection options, thereby enabling the user to navigate the menu hierarchy via the display screen and input buttons. For example, in certain embodiments, when it is desired to operate the unit in high power output mode, the lockout screw 101 is inserted into the threaded opening 102 and the unit 100 is activated. When the unit 100 is activated while the lockout screw 101 is present in the opening 102, the user may access high power values or functions on the device 100. An indication of the selected power setting may be output to an LED display.

In some embodiments, the laser power level selection function can be accessed using an actuator on the unit, e.g., via buttons, dials, and/or a function menu appearing on the display screen. In certain embodiments, onscreen indicia may be provided to provide visual output of the selected laser power output level.

In laser devices employing a laser safety lockout screw 101, when it is desired to allow access to high power operation, the laser safety lockout screw 101 is placed into an installed position (threaded opening 102) in the casing. In preferred embodiments, the laser device contains a push button switch aligned with the path of travel of the screw, wherein the push button switch 105 is activated by the screw when it is fully threaded into the stored position, thereby allowing user access to high power laser functions.

Figure 5:
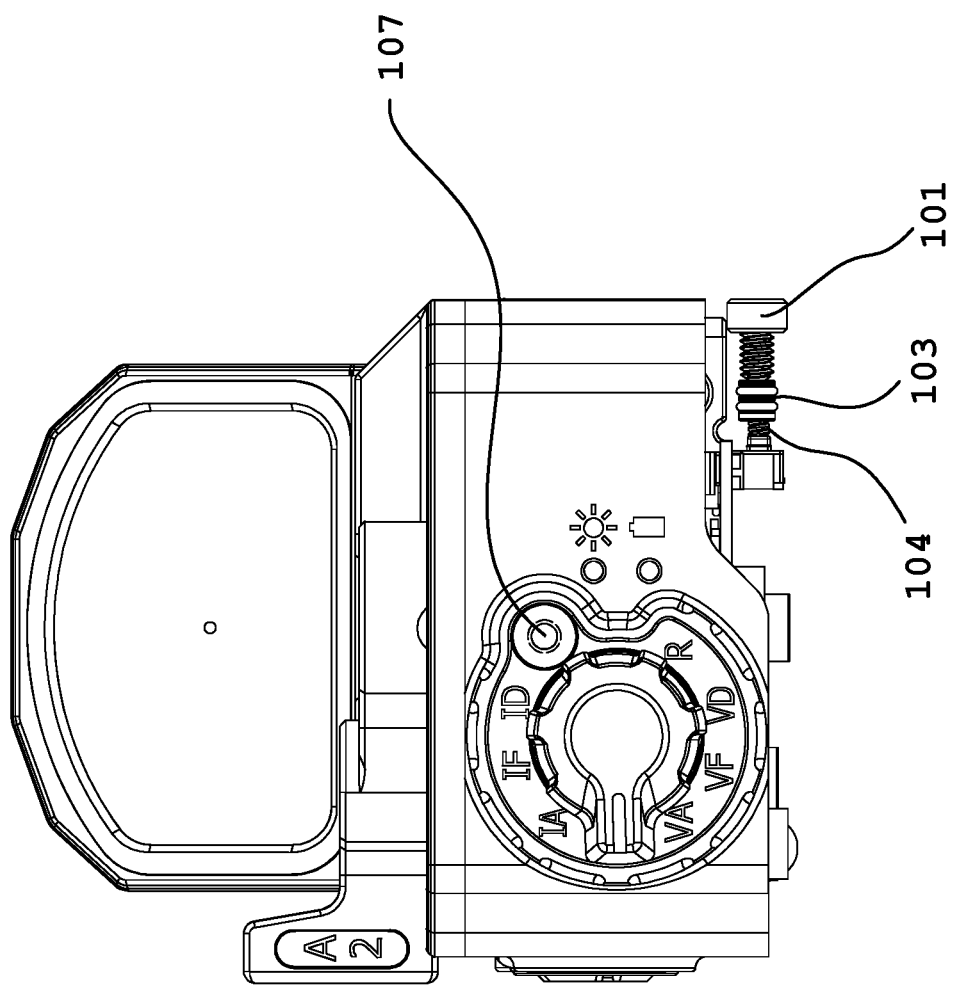
FIG. 5 is a front view of the device incorporating a lockout switch, showing the screw actuator in the stored position.

In preferred embodiments, when the laser safety lockout screw 101 is fully threaded into the installed position, the laser safety lockout screw presses the push button switch (e.g., to close a normally open switch) and allows high power laser functions to activate. When the laser safety lockout screw is removed from the installed position, the push button switch is not activated (i.e., the switch is returned to its normally open state) and high power laser functions are not accessible. In certain preferred embodiments, the housing of the laser device 100 will further include a stored position 107, as shown in FIG. 5, whereby the safety lockout screw may be positioned when not in the installed position. In particularly preferred embodiments, when the laser safety lockout screw is not inserted in the installed position, such as when it is in the stored position or otherwise absent from the opening 102, only the current laser power mode will be available. In this manner, users are prevented from accidentally operating the unit 100 at high (e.g., eye damaging) laser power mode in certain situations where high power operation creates a potential danger or is otherwise unnecessary, such as in training.

It will be recognized that the laser power selector may be implemented using physical hardware controls, such as dials, buttons, keypads, and the like, wherein the presence or absence of the lockout screw limit determines whether laser intensities above a preselected threshold levels can be selected using the selector controls. Alternatively or additionally, the laser power selector may be implemented using a software or firmware interface such as a graphical user interface, menu driven interface, or the like, wherein the presence or absence of the lockout screw limit determines whether laser intensities above a preselected threshold levels are available to be selected using the software or firmware selector controls.

Figure 2:
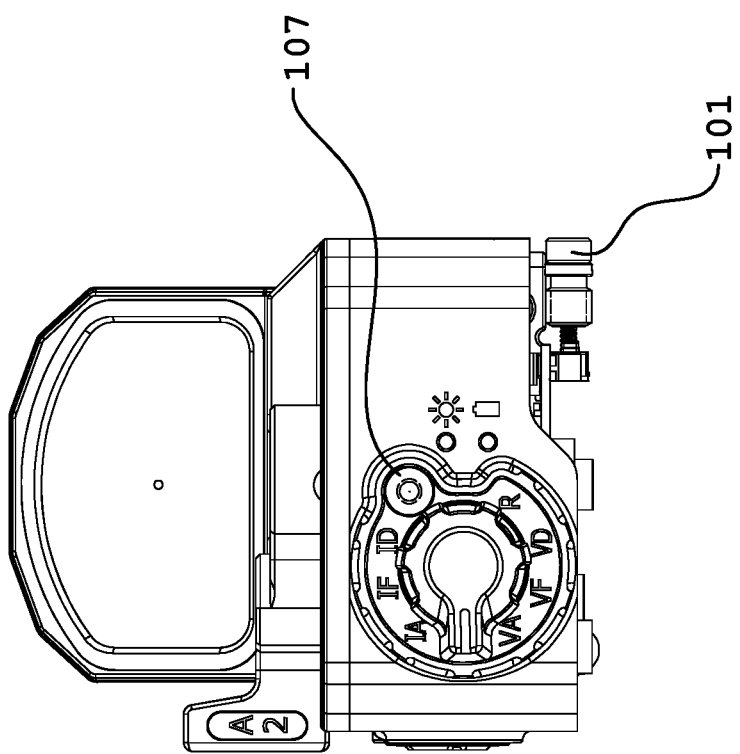
FIG. 2 is an isometric view of the device incorporating the lockout switch with portions of the housing removed, showing the screw actuator in the installed position, taken generally from the front.
Figure 3:
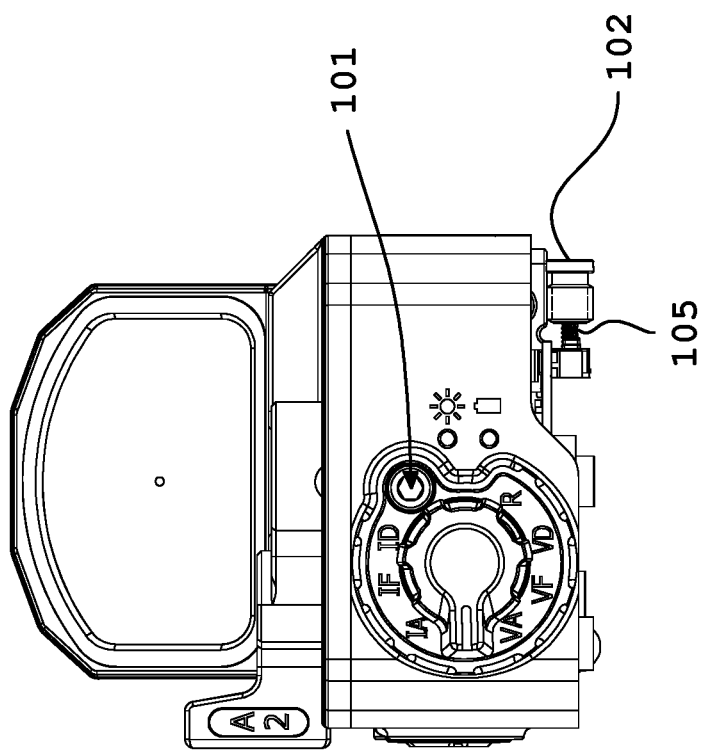
FIG. 3 is an enlarged front view of the device incorporating a lockout switch, showing the push button mechanism, with portions of the housing removed for illustration purposes.
Figure 4:
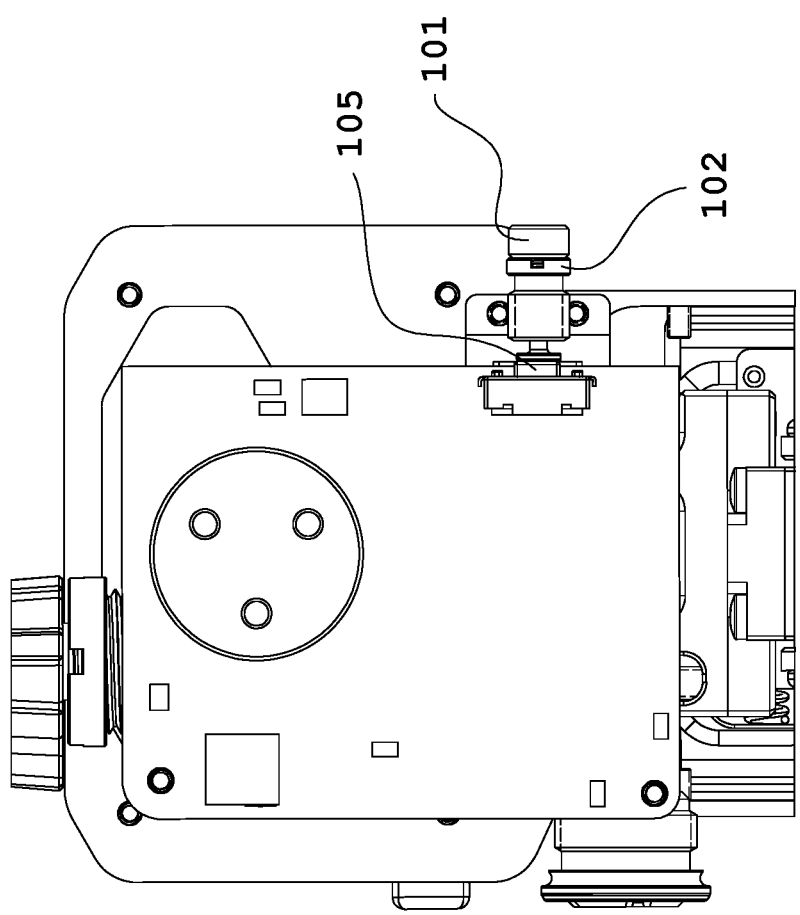
FIG. 4 is an enlarged bottom view of the device incorporating a lockout switch, showing the screw actuator in the installed state, with portions of the housing removed for illustration purposes.

As best seen in FIG. 2, a threaded lockout screw 101 engages a complementary threaded opening 102 in the housing shell of the device 100 (partially omitted in FIG. 2 for ease of illustration). Rotatably advancing the screw 101 causes a movable plunger 103 to move into engagement with a switch 105. The state of the switch 105 in turn controls the range of power output levels accessible by the user. In certain embodiments, when the screw 101 is fully advanced into the opening 102, the plunger 103 closes the switch 105, thereby enabling the lasers to operate in a high power mode. In the illustrated embodiment, a compression spring 104 is provided between the plunger and the switch 105 to bias the plunger away from the switch.

The switch 105 is coupled to circuitry positioned within in the housing, which may include a microprocessor and associated coded logic/program instruments for controlling the power output of the lasers.

In certain embodiments, when the screw 101 is received within the opening 102, it allows the user to access the high laser power levels, e.g., using a button, dial, and/or function menu on the device 100. In alternative embodiments, other methods for selecting high laser power modes of operation are contemplated. For example, it is contemplated that the unit 100 could have a dedicated high and low power selector, wherein the high power selector is disabled unless the screw 101 is received within the opening 102.

In certain embodiments, a threaded opening 107 may be provided on the housing of the unit 100 for storing and preventing loss the screw 101 when the screw is not received in the opening 102, i.e., when high power laser intensity levels are not intended. The positions of the switch 105 and threaded opening 102 illustrated are exemplary only and other configurations are contemplated.

In certain embodiments, it is contemplated that the head of the screw 101 has a keyed configuration such that a special key or removal tool is required for its insertion and/or removal.

In alternative embodiments, the function of the threaded lockout screw 101 when it engages the complementary threaded opening 102 could be reversed, that is, the presence of the screw 101 and actuation of the switch serves to prevent operation of the lasers at high power levels and removal of the screw 101 from the opening 102 allows the lasers to be operated at high power levels.

In certain embodiments, powering the device 100 off and removing the lockout screw 101 from the threaded opening 102 will cause the device 100 to remain at the then in effect selected or available power levels until it is changed again with the screw 101. In alternative embodiments, powering the unit 100 off and removing the lockout screw 101 from the threaded opening 102 will cause the unit 100 to reset to a lower power (e.g., eye safe) mode until it is changed again with the screw 101.

Preferably, when the power level is set to high power mode, all lasers will be operable in high power (e.g., non-eye-safe) modes and when the power level is set to the low power mode, all lasers will be operably only at low power (e.g., eye safe) modes. However, in other embodiments, individual adjustment of the laser power output is also contemplated.

In certain embodiments, setting the laser power output to the high power mode may cause the laser output to be set to some predetermined or fixed high power level and setting the laser power output to the low power mode may cause the laser output to be set to some predetermined or fixed low or eye-safe power level.

In certain embodiments, there is provided a range of selectable laser power levels. The number of levels may be, for example, from 5 to 10, and preferably about 8. When a range of laser power levels is provided, the lockout screw functions to limit the maximum laser power output level. For example, when the lockout screw is removed, the full range of laser power output levels are available. When the lockout screw is present, only levels that do not exceed some preselected power level (e.g., a level which is eye-safe) are available.

In certain embodiments, the laser power output level may be adjusted using the input buttons such as laser increment and decrement buttons 110, 112. For laser devices having a graphical or menu-based user interface, the laser power adjustment may be made using the user interface, wherein the presence or absence of the lockout screw determines the availability of power options.

It is contemplated that in some instances, the screw 101 or a key or tool allowing insertion and removal of the screw 101 could be issued to the end user, who could set the unit to a desired mode by placing the screw into opening 102 or 107. In other instances, it is contemplated that access to the screw 101 or a complementing tool or key therefor can be limited to certain supervisory personnel, who would remove the screw 101 prior to issuing the units to the end users if necessary to restrict the end user's ability to access high power levels.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims and their equivalents.

What is claimed is:

1. A lockout system for a laser device, the laser device having a laser emitter operable to emit a laser beam at a plurality of intensity levels, the lockout system comprising:
    a lockout switch, wherein the lockout switch includes a push button switch, the lockout switch operable to be placed in either a first state or a second state, wherein the laser device is configured to prevent actuation of the laser emitter at an intensity level above a preselected threshold intensity level when the lockout switch is in the first state and to permit actuation of the laser emitter at an intensity level above the preselected threshold intensity level when the lockout switch is in the second state;
    a lockout key operable to transition the lockout switch between the first state and the second state, wherein the lockout key is a threaded screw;
    a first opening, wherein the first opening is a threaded opening configured to removably receive the lockout key; and
    a movable plunger, wherein the movable plunger is in operable connection with the push button switch.

2. The lockout system of claim 1, wherein the preselected threshold intensity level is an intensity level above which eye exposure causes eye damage to occur.

3. The lockout system of claim 1, further comprising:
    a housing for housing the laser device.

4. The lockout system of claim 3, wherein the lockout switch is placed in the first state when the lockout key is received in the first opening and the lockout switch is placed in the second state when the lockout key is not received in the first opening.

5. The lockout system of claim 3, wherein the lockout switch is placed in the second state when the lockout key is received in the first opening and the lockout switch is placed in the first state when the lockout key is not received in the first opening.

6. The lockout system of claim 3, further comprising a second opening configured to removably receive the lockout key for storing the lockout key when the lockout key is not received in the first opening.

7. The lockout system of claim 6, wherein the second opening is a threaded opening.

8. The lockout system of claim 3, further comprising a tool configured for inserting the lockout key into and removing the lockout key from the first opening.

9. The lockout system of claim 1, further comprising:
    a compression spring disposed between the lockout switch and the movable plunger, the compression spring for biasing the movable plunger away from the push button switch, the movable plunger engaging the push button switch and the lockout key when the lockout key is inserted into the first opening.

10. The lockout system of claim 1, wherein the lockout switch is electrically coupled to a microprocessor coded for controlling power output of the laser emitter.

11. A laser sight device for a weapon, the laser sight device comprising:
    a housing attachable to the weapon;
    a laser emitter disposed within the housing and operable to emit a laser beam at a plurality of intensity levels;
    a lockout switch, wherein the lockout switch includes a push button switch, the lockout switch operable to be placed in either a first state or a second state, wherein the laser sight device is configured to prevent actuation of the laser emitter at an intensity level above a preselected threshold intensity level when the lockout switch is in the first state and to permit actuation of the laser emitter at an intensity level above the preselected threshold intensity level when the lockout switch is in the second state;
    a lockout key operable to transition the lockout switch between the first state and the second state, wherein the lockout key is a threaded screw;
    a first opening, wherein the first opening is a threaded opening configured to removably receive the lockout key; and
a movable plunger, wherein the movable plunger is in operable connection with the push button switch.

12. The laser sight device of claim 11, wherein the preselected threshold intensity level is an intensity level above which eye exposure causes eye damage to occur.

13. The laser sight device of claim 11, wherein the lockout switch is placed in the first state when the lockout key is received in the first opening and the lockout switch is placed in the second state when the lockout key is not received in the first opening.

14. The laser sight device of claim 11, wherein the lockout switch is placed in the second state when the lockout key is received in the first opening and the lockout switch is placed in the first state when the lockout key is not received in the first opening.

15. The laser sight device of claim 11, further comprising a second opening configured to removably receive the lockout key for storing the lockout key when the lockout key is not received in the first opening.

16. The laser sight device of claim 15, wherein the second opening is a threaded opening.

17. The laser sight device of claim 11, further comprising:
a compression spring disposed between the lockout switch and the movable plunger, the compression spring for biasing the movable plunger away from the push button switch, the movable plunger engaging the push button switch and the lockout key when the lockout key is inserted into the first opening.

18. The laser sight device of claim 11, wherein the lockout switch is electrically coupled to a microprocessor coded for controlling power output of the laser emitter.

19. The laser sight device of claim 11, wherein said plurality of intensity levels includes one or more laser intensity levels that are below said preselected intensity threshold level and one or more laser intensity levels that are above said preselected intensity threshold level.

20. The laser sight device of claim 19, further comprising a user-actuated laser intensity selector, wherein the user-actuated laser intensity selector is inoperable to select the one or more laser intensity levels that are above the preselected threshold laser intensity level when the lockout switch is in the first state.

21. The laser sight device of claim 20, wherein the user-actuated laser intensity selector is selected from the group consisting of one or more push buttons disposed on the housing, a keypad associated with laser sight device, and an on screen interface displayed on a display screen associated with the sight device.

* * * * *